US012334412B2

(12) United States Patent
Yeh

(10) Patent No.: US 12,334,412 B2
(45) Date of Patent: Jun. 17, 2025

(54) ELECTRONIC PACKAGE AND METHOD OF FORMING THE SAME

(71) Applicant: Advanced Semiconductor Engineering, Inc., Kaohsiung (TW)

(72) Inventor: Chang-Lin Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 602 days.

(21) Appl. No.: 17/569,446

(22) Filed: Jan. 5, 2022

(65) Prior Publication Data

US 2023/0215775 A1 Jul. 6, 2023

(51) Int. Cl.
*H01L 23/36* (2006.01)
*H01L 23/367* (2006.01)
*H01L 23/373* (2006.01)

(52) U.S. Cl.
CPC ...... *H01L 23/3677* (2013.01); *H01L 23/3736* (2013.01)

(58) Field of Classification Search
CPC ....... H01L 23/34; H01L 23/36; H01L 23/367; H01L 23/42
See application file for complete search history.

(56) References Cited

U.S. PATENT DOCUMENTS

| 7,078,800 | B2 | 7/2006 | Kwon et al. |
| 2018/0249593 | A1* | 8/2018 | Zhang ............... B29C 48/04 |
| 2019/0172816 | A1* | 6/2019 | Kim .................. H01L 23/552 |
| 2020/0357764 | A1* | 11/2020 | Das Mahapatra ...... H01L 23/42 |
| 2021/0225729 | A1* | 7/2021 | Bozorg-Grayeli ........................ H01L 21/4853 |

FOREIGN PATENT DOCUMENTS

| CN | 1894791 B | * | 1/2011 | ........... B23K 35/302 |
| CN | 205452265 U | * | 8/2016 | ........... H01L 23/053 |
| KR | 102161173 B1 | * | 9/2020 | |

* cited by examiner

*Primary Examiner* — Walter H Swanson
*Assistant Examiner* — Moataz Khalifa
(74) *Attorney, Agent, or Firm* — FOLEY & LARDNER LLP

(57) ABSTRACT

An electronic package is provided in the present disclosure. The electronic package comprises: an electronic component; a thermal conductive element above the electronic component, wherein thermal conductive element includes a first metal; an adhesive layer between the electronic component and the thermal conductive element, wherein the first adhesive layer includes a second metal; and an intermetallic compound (IMC) between the first metal and the second metal.

8 Claims, 11 Drawing Sheets

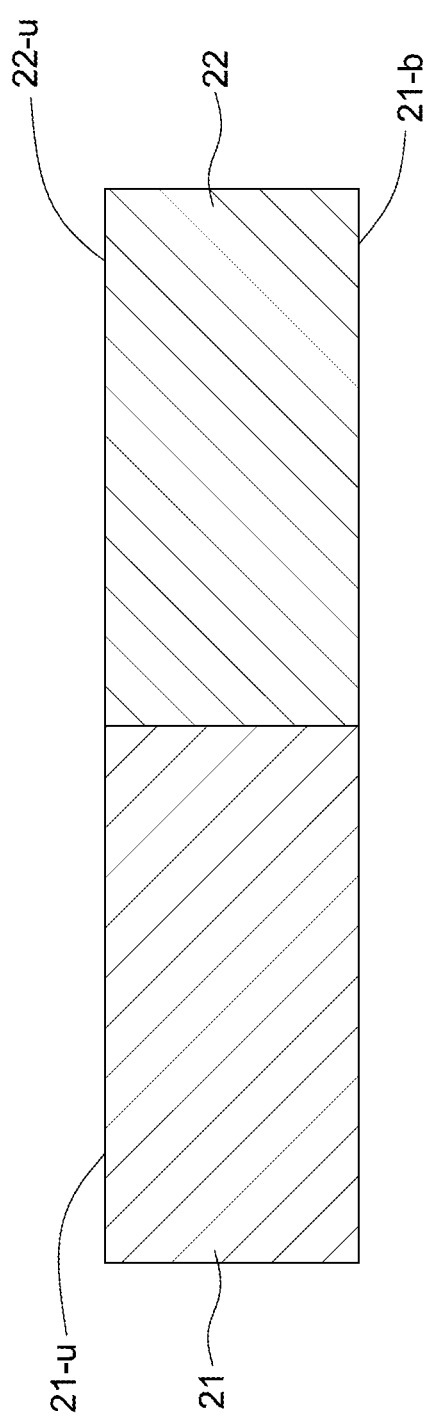
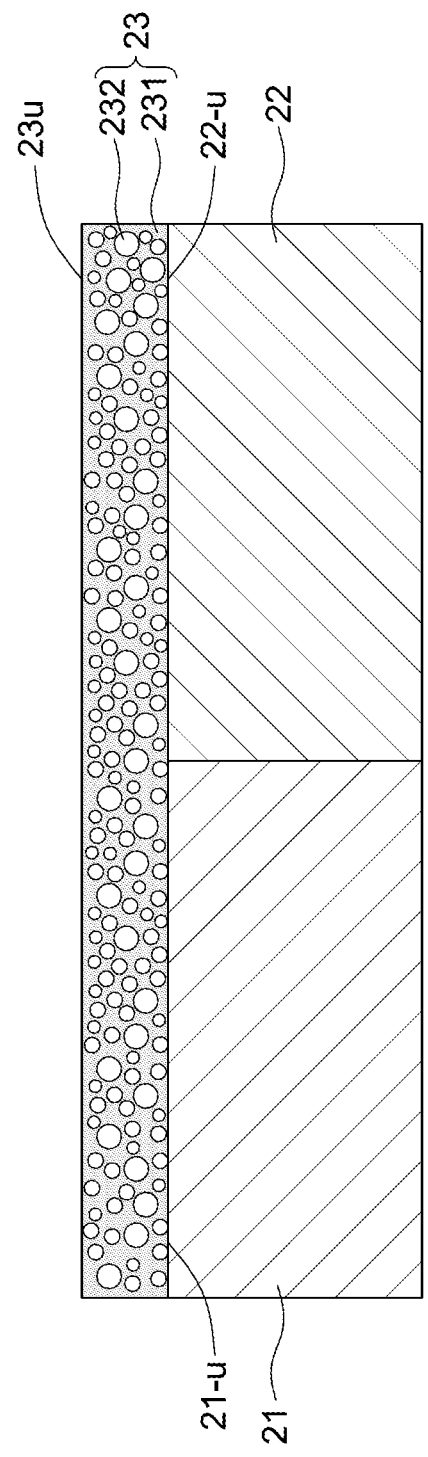

ELECTRONIC PACKAGE AND METHOD OF FORMING THE SAME

BACKGROUND

1. Technical Field

The present disclosure relates to an electronic package, and more particularly, to an electronic package including a metallic thermal interface material (TIM) and an adhesive layer with metal particles.

2. Description of the Related Art

Conventionally, an electronic device is usually connected to a heat spreading component such as a heat sink for heat dissipation using a polymeric thermal interface material (TIM). However, the polymeric TIM may not be an ideal material since the thermal conductivity of the polymeric TIM is lower than that of a metal material.

SUMMARY

In an aspect, an electronic package is provided. The electronic package comprises: an electronic component; a thermal conductive element above the electronic component, wherein thermal conductive element includes a first metal; an adhesive layer between the electronic component and the thermal conductive element, wherein the first adhesive layer includes a second metal; and an intermetallic compound (IMC) between the first metal and the second metal.

In an aspect, an electronic package is provided. The electronic package comprises: an electronic component; a thermal conductive structure above the electronic component; and an intermediate layer between the electronic component and the thermal conductive structure, wherein the intermediate layer comprises a metal particle exposed from a surface of the intermediate layer and contact the thermal conductive structure.

In an aspect, a method of forming an electronic package is provided. The method comprises: an electronic component; a thermal conductive element above the electronic component; and an intermediate layer between the electronic component and the thermal conductive element, wherein an upper surface of the intermediate layer comprises a recessed portion, and wherein the thermal conductive element extends into the recessed portion of the upper surface of the intermediate layer.

BRIEF DESCRIPTION OF THE DRAWINGS

Aspects of some embodiments of the present disclosure are readily understood from the following detailed description when read with the accompanying figures. It should be noted that various structures may not be drawn to scale, and dimensions of the various structures may be arbitrarily increased or reduced for clarity of discussion.

FIG. 3A. FIG. 3B, FIG. 3C, FIGS. 3D, 3E, and 3F each illustrates a schematic cross-sectional view of a structure at various fabrication stages using a method for manufacturing an electronic package according to some embodiments of the present disclosure.

DETAILED DESCRIPTION

Figure 1:
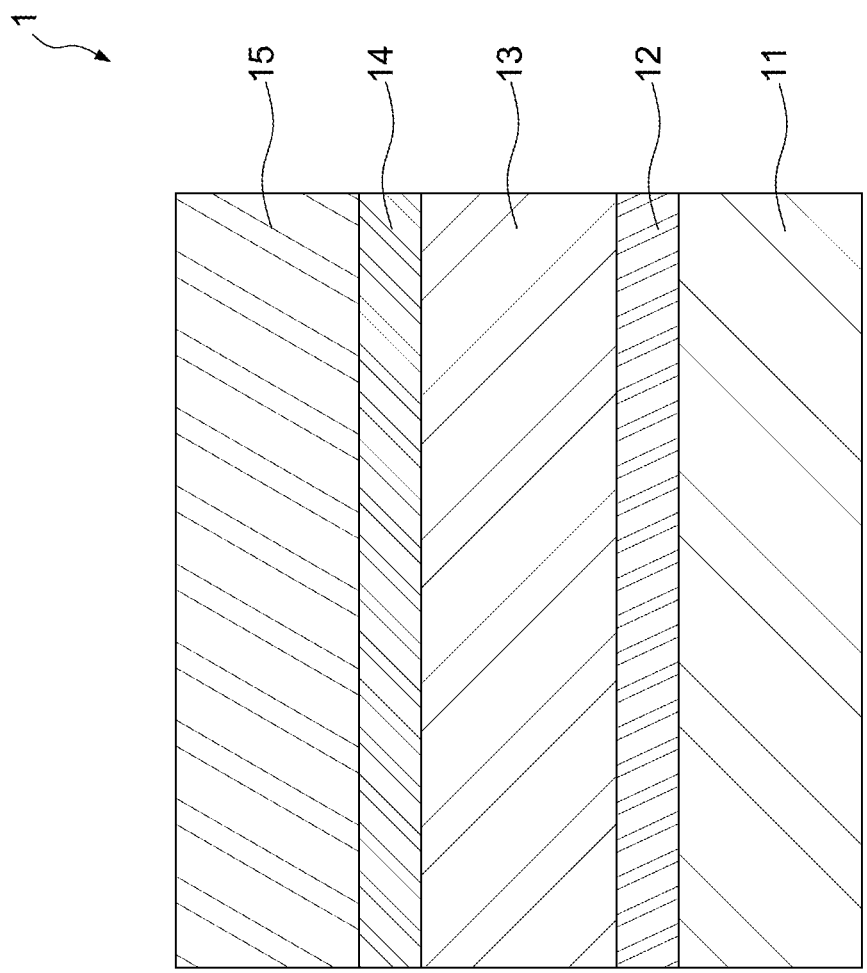
FIG. 1 illustrates a schematic cross-sectional view of an electronic package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "top," "bottom," "higher," "lower," "under," and so forth, are indicated with respect to the orientation shown in the figures unless otherwise specified. It should be understood that the spatial descriptions used herein are for purpose of illustration only, and that practical implementations of the structures described herein can be spatially arranged in any orientation or manner, provided that the merits of embodiments of this disclosure are not deviated by such arrangement. As used herein, the singular terms "a," "an," and "the" may include plural referents unless the context clearly dictates otherwise.

To address the issue of poor heat dissipation for the electronic device due to the use of the polymeric TIM, the present disclosure provides an electronic package including a metallic TIM and an adhesive layer with metal particles. As the metallic TIM has better thermal conductivity, the use of the metallic TIM improves heat dissipation from the electronic device. The use of the adhesive layer with metal particles improves heat dissipation as well as the reliability of the connections between different components. Also, the use of the adhesive layer substantially lower the cost of manufacturing an electronic package including a metallic TIM.

FIG. 1 illustrates a schematic cross-sectional view of an electronic package 1 according to some embodiments of the present disclosure. Referring to FIG. 1, the electronic package 1 includes an electronic device 11, an intermediate layer 12, a metallic thermal interface material (TIM) layer 13, a metallic coating layer 14, and a heat spreading component 15. The metallization layer 12 is formed on a backside (non-active side) of the electronic device 11. The metallic TIM layer 13 is formed on the intermediate layer 12. The heat spreading component 15 is coated with the metallic coating layer 14. The heat spreading component 15 and the metallic coating layer 14 are formed on the metallic TIM layer 13 with the metallic coating layer 14 contacting the metallic TIM layer 13.

In some embodiments of the present disclosure, the electronic device 11 includes semiconductor materials such as silicon (Si) material. In some embodiments of the present disclosure, the metallization layer 12 includes a combination of a gold (Au) layer or a silver (Ag) layer, a nickel (Ni) layer, and a titanium (Ti) layer. In some embodiments of the present disclosure, the intermediate layer 12 includes a combination of a gold (Au) layer with a thickness about 500 nm, a nickel (Ni) layer with a thickness about 300 nm, and a titanium (Ti) layer with a thickness about 100 nm.

In some embodiments of the present disclosure, the metallic TIM layer 13 includes metal materials such as indium (In) (or indium solder) and/or silver (Ag) sinter. In some embodiments of the present disclosure, the metallic coating layer 14 includes metal materials such as nickel/gold (Ni/Au) or nickel/silver (Ag). In some embodiments of the present disclosure, the heat spreading component 15 includes a heat sink. In some embodiments of the present disclosure, the heat spreading component 15 includes metal materials such as copper (Cu) or aluminum (Au).

In order to bond the heat spreading component 15 with the metallic TIM layer 13, a metallic coating layer 14 is needed between the heat spreading component 15 and the metallic TIM layer 13 such that the metallic coating layer 14 and the metallic TIM layer 13 are bonded through metal-to-metal bonding. Also, in order to bond the metallic TIM layer 13 with the electronic device 11, the intermediate layer 12 is needed between the metallic TIM layer 13 and the electronic device 11. The intermediate layer 12 may include a combination of multiple metal layers such as a gold (Au) layer or a silver (Ag) layer, a nickel (Ni) layer, and a titanium (Ti) layer. By forming the intermediate layer 12 on the backside of the electronic device 11, the electronic device 11 can be connected to the metallic TIM layer 13 through the intermediate layer 12. However, as gold material is expansive and a relatively thick layer of gold (e.g., a thickness about 500 nm) is needed in the intermediate layer 12, the use of intermediate layer 12 causes higher cost of the fabrication of the electronic package 1.

Figure 2:
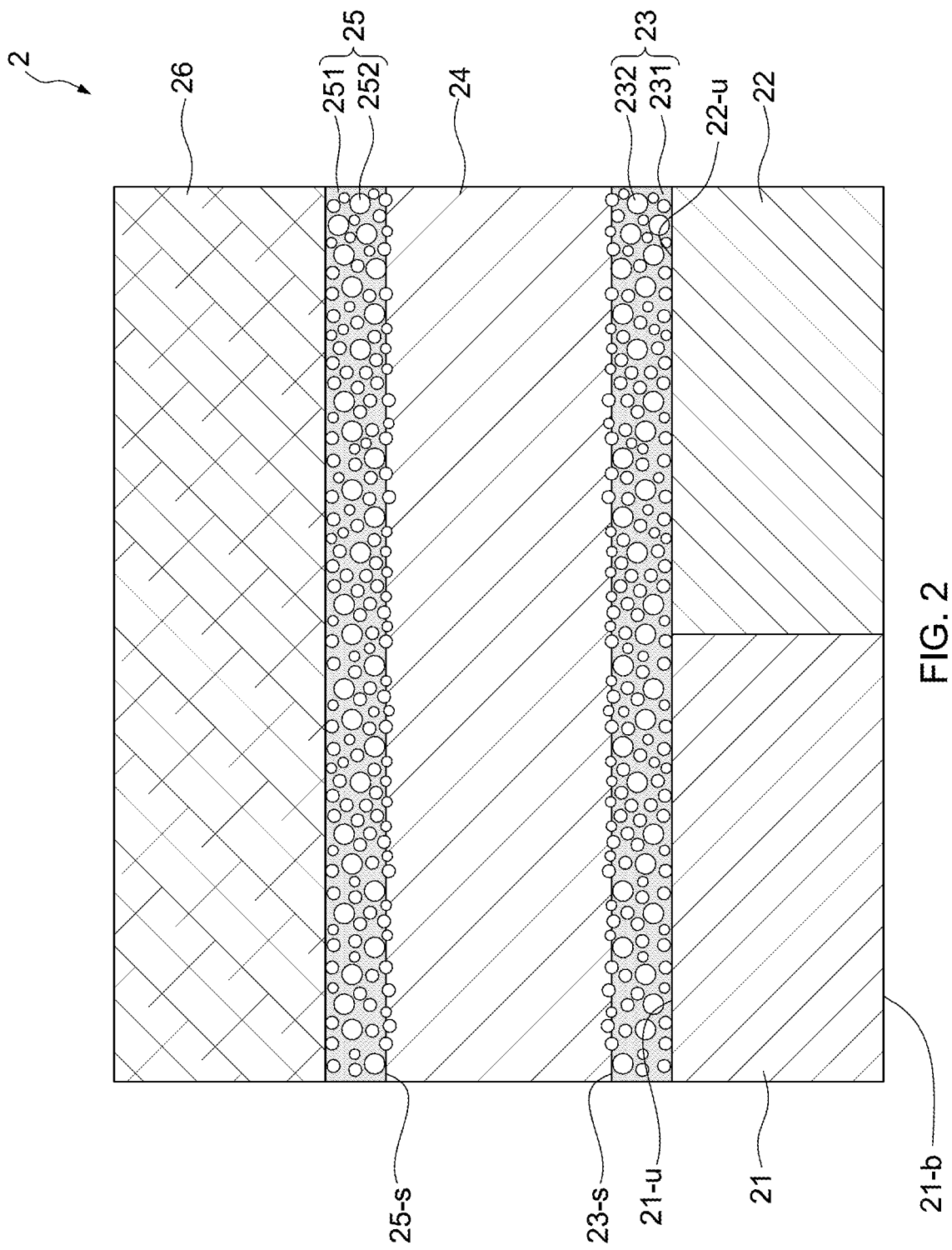
FIG. 2 illustrates a schematic cross-sectional view of an electronic package according to some embodiments of the present disclosure.

FIG. 2 illustrates a schematic cross-sectional view of an electronic package 2 according to some embodiments of the present disclosure. Referring to FIG. 2, the electronic package 2 includes an electronic device 21, an encapsulant 22, a first adhesive layer 23, a thermal conductive element 24, a second adhesive layer 25, and a heat spreading component 26. In some embodiments of the present disclosure, the first adhesive layer 23 is referred to as the first intermediate layer 23. In some embodiments of the present disclosure, the second adhesive layer 25 is referred to as the second intermediate layer 25. In some embodiment of the present disclosure, thermal conductive element 24 is a metallic thermal interface material (TIM) layer 24.

As shown in FIG. 2, the encapsulant 22 is adjacent to or encapsulates the electronic device 21. In some embodiments of the present disclosure, the encapsulant 22 is optional. The first adhesive layer 23 is formed on an upper surface 21-$u$ of the electronic device 21 (which is a backside surface or a non-active side surface of the electronic device 21) and an upper surface of the encapsulant 22. In some embodiments of the present disclosure, the upper surface 21-$u$ is substantially coplanar with the upper surface 22-$u$ of the encapsulant 22. The metallic TIM layer 24 is formed on the first adhesive layer 23. The second adhesive layer 25 is formed on the metallic TIM layer 24, and the heat spreading component 26 is formed on the second adhesive layer 25.

Referring to FIG. 2, the first adhesive layer 23 includes an adhesive material 231 and metal particles 232, and the second adhesive layer 25 includes an adhesive material 251 and metal particles 252. As shown in FIG. 2, the metal particles 232 are distributed in the first adhesive layer 23, and a portion of the metal particles 232 are at least partially exposed from (or extruded from) an upper surface 23-$s$ of the adhesive layer 23. As shown in FIG. 2, the metal particles 252 are distributed in the second adhesive layer 25, and a portion of the metal particles 252 are at least partially exposed from (or extruded from) a surface 25-$s$ of the adhesive layer 25. As shown in FIG. 2, some of the metal particles 232 are at least partially embedded in the metallic TIM layer 24 and are bonded with the metallic TIM layer 24. As shown in FIG. 2, some of the metal particles 252 are at least partially embedded in the metallic TIM layer 24 and are bonded with the metallic TIM layer 24.

In some embodiments of the present disclosure, the electronic device 21 includes semiconductor materials such as silicon (Si) material. In some embodiments of the present disclosure, the encapsulant 22 include molding compounds such as an epoxy compound. In some embodiments of the present disclosure, the metallic TIM layer 24 includes indium (In) (or indium solder) material and/or silver (Ag) sinter material. In some embodiments of the present disclosure, the metallic TIM layer 24 has a thermal conductivity (k) greater than 50 Watt/meter·K and a thickness of about 20 to 200 μm. In some embodiments of the present disclosure, the heat spreading component 26 includes a heat sink. In some embodiments of the present disclosure, the heat spreading component 26 includes metal materials such as copper (Cu) or aluminum (Al).

In some embodiments of the present disclosure, the adhesive material 231 includes polymer material such as epoxy resin. In some embodiments, the metal particles 232 have different substantially the same sizes and shapes. In some embodiments, the metal particles 232 have different sizes and shapes. In some embodiments, the metal particles 232 have a sphere shape or an ellipsoid shape. In some embodiments of the present disclosure, the metal particles 232 includes metal materials such as copper (Cu) and silver (Ag) materials. In some embodiments of the present disclosure, the metal particles 232 includes metal materials such as gold (Au), aluminum (Al), and nickel (Ni), materials. In some embodiments of the present disclosure, the first adhesive layer 23 has a thermal conductivity (k) less than 50 Watt/meter·K and a thickness of about 0.1 to 10 μm.

In some embodiments of the present disclosure, the adhesive material 251 includes polymer material such as epoxy resin. In some embodiments, the metal particles 252 have different substantially the same sizes and shapes. In some embodiments, the metal particles 252 have different sizes and shapes. In some embodiments, the metal particles 252 have a sphere shape or an ellipsoid shape. In some embodiments of the present disclosure, the metal particles 252 includes metal materials such as copper (Cu) and silver (Ag) materials. In some embodiments of the present disclosure, the metal particles 252 includes metal materials such as gold (Au), aluminum (Al), and nickel (Ni), materials. In some embodiments of the present disclosure, the second adhesive layer 25 has a thermal conductivity (k) less than 50 Watt/meter·K and a thickness of about 0.1 to 10 μm.

FIGS. 3A-3E each illustrates a schematic cross-sectional view of a structure at various fabrication stages using a method for manufacturing an electronic package 2 according to some embodiments of the present disclosure.

Referring to FIG. 3A, the electronic device 21 is provided, and the encapsulant 22 is formed adjacent to and/or encapsulating the electronic device 21. In FIG. 3A, the lower surface 21-b of the electronic device 21 may include the active surface of the electronic device 21 and the upper surface 21-u of the electronic device 21 may include the non-active surface of the electronic device 21. In some embodiments of the present disclosure, the upper surface 21-u of the electronic device 21 is substantially coplanar with the upper surface 22-u of the encapsulant 22. In some embodiments of the present disclosure, the electronic device 21 and the encapsulant 22 may both be formed on a substrate; however, the substrate is not shown in the drawings for simplification.

Referring to FIG. 3B, the first adhesive layer 23, including the adhesive material 231 and the metal particles 232, is formed on the upper surface 21-u of the electronic device 21 and the upper surface 22-u of the encapsulant 22. The adhesive material 231 provides adhesion between the adhesive layer 23 and the electronic device 21 and provides adhesion between the first adhesive layer 23 and the encapsulant 22. In some embodiments of the present disclosure, the first adhesive layer 23 can be formed on the upper surface 21-u of the electronic device 21 and the upper surface 22-u of the encapsulant 22 through a spraying, spin coating, or printing process.

Figure 3C:
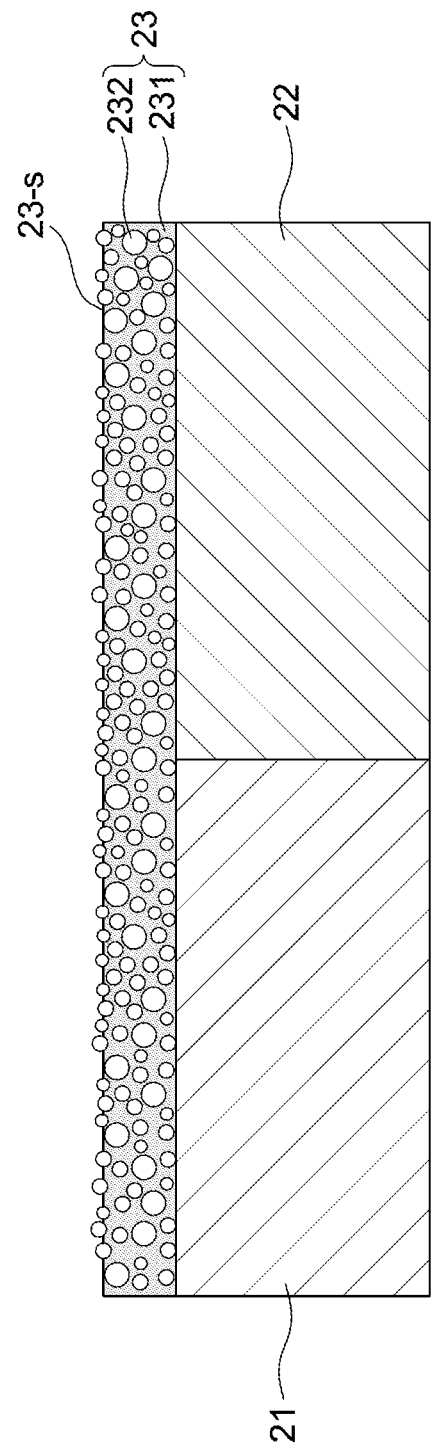

Referring to FIG. 3C, at least an upper portion of the adhesive layer 23 adjacent to an upper surface 23-u of the adhesive layer 23 is removed so that a new upper surface 23-s of the adhesive layer 23 is formed. In some embodiments of the present disclosure, the upper surface 23-s of the adhesive layer 23 includes a substantially flat surface and/or a rough surface with protruded portions. By removing the upper portion of the adhesive layer 23, some of the metal particles 232 are at least partially exposed from (or protruded from) the adhesive layer 23, which may form protrusions protruding from the upper surface 23-s. In some embodiments of the present disclosure, the metallic TIM layer 24 extends between the protruded portions and between the protrusions. In some embodiments of the present disclosure, the upper portion of the first adhesive layer 23 is removed by wet etching or dry etching. In some embodiments of the present disclosure, the upper portion of the first adhesive layer 23 is removed by a chemical process. In some embodiments of the present disclosure, the upper portion of the first adhesive layer 23 is removed by having a portion of the resin material of the adhesive material 231 evaporated from the first adhesive layer 23 by a laser process. In some embodiments of the present disclosure, the upper portion of the first adhesive layer 23 is removed by a plasma process. In some embodiments of the present disclosure, the upper portion of the first adhesive layer 23 can be removed by using other known techniques.

Figure 3D:
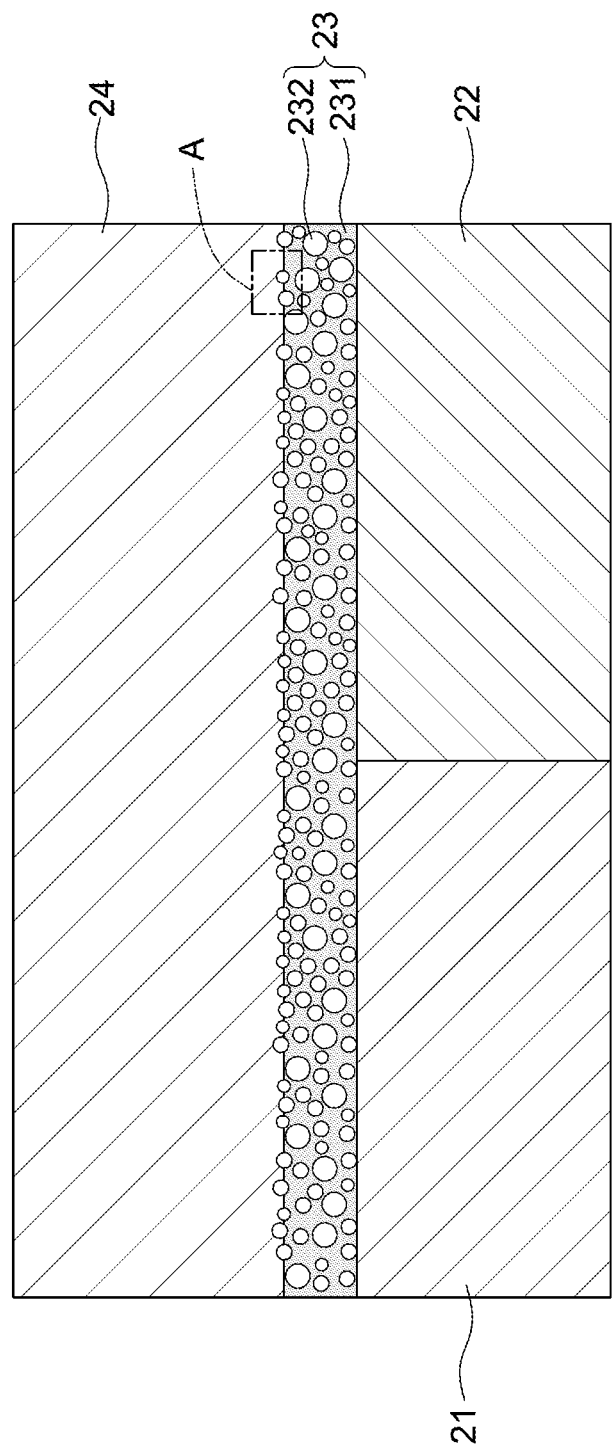

Referring to FIG. 3D, the metallic TIM layer 24 is formed on the upper surface 23-s of the first adhesive layer 23. In some embodiments of the present disclosure, the metallic TIM layer is applied on the upper surface 23-s of the first adhesive layer 23 through a patterning process. In some embodiments of the present disclosure, the metallic TIM layer 24 is melted before being applied on the first adhesive layer 23. In some embodiments of the present disclosure, the metallic TIM layer 24 is cured after being applied on the first adhesive layer 23. In some embodiments of the present disclosure, the metallic TIM layer 24 is formed over both of the electronic device 21 and the encapsulant 22, and covers both of the electronic device 21 and the encapsulant 22 from a top view perspective. In some embodiments of the present disclosure, the metallic TIM layer 24 is formed over the electronic device 21 and over a portion of the encapsulant 22, and covers the electronic device 21 and the portion of the encapsulant 22 from a top view perspective. In some embodiments of the present disclosure, the metallic TIM layer 24 is formed over the upper surface 21-u of the electronic device 21 and covers the electronic device 21 from a top view perspective, but is free from covering the encapsulant from a top view perspective. By not forming the metallic TIM layer 24 over the upper surface 22-2 of the encapsulant 22 or by forming the metallic TIM layer 24 over only a portion of the upper surface 22-2 of the encapsulant 22, less metallic thermal interface material is used, and thus less cost is needed.

As shown in FIG. 3D, the metal particles 232 exposed from (or protruded from) the first adhesive layer 23 are at least partially embedded in (or accommodated by) the metallic TIM layer 24. Since the metallic TIM layer 24 and the metal particles both includes metal materials, the metallic TIM layer 24 will form strong bonding with the metal particles 232 at the interfaces between the metallic TIM layer 24 and the metal particles 232, as shown in the box "A" enclosed by the dashed-line, which will be discussed in further detail below with respect to FIG. 4A and FIG. 4B. Thus, the metallic TIM layer 24 may be attached to or connected to the first adhesive layer 23 by the adhesion of the adhesive material 231 of the first adhesive layer 23 and the bonding between the metallic TIM layer 24 and the metal particles 232.

Figure 3E:
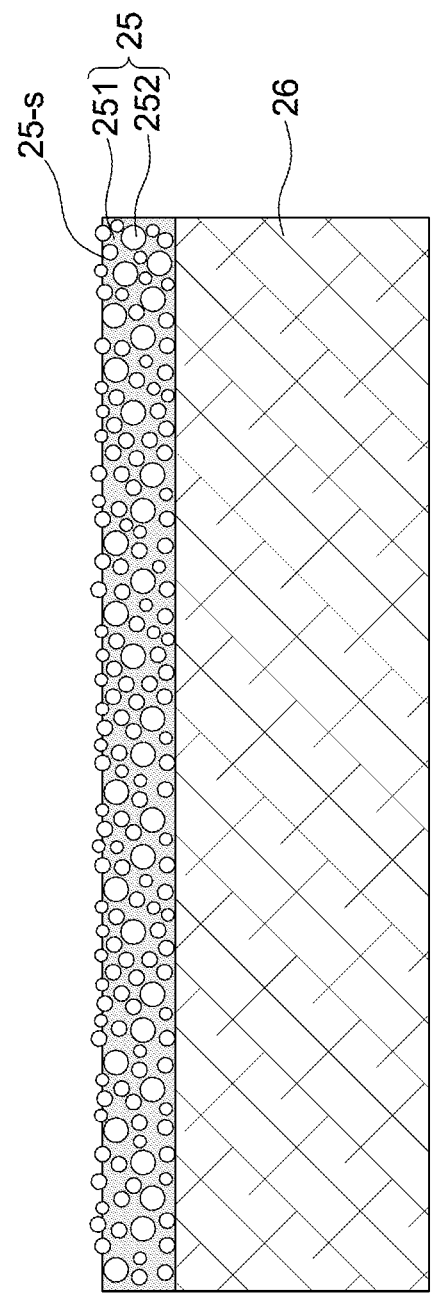

Referring to FIG. 3E, the heat spreading component 26 is provided, and the second adhesive layer 25 is formed on the heat spreading component 26. In some embodiments of the present disclosure, the second adhesive layer 25 can be formed on the heat spreading component 26 through a spraying, spin coating, or printing process.

As shown in FIG. 3E, the second adhesive layer 25 includes the adhesive material 251 and the metal particles 252. As shown in FIG. 3E, at least an upper portion of the second adhesive layer 25 has been removed so as to form a surface 25-s. After removing the upper portion of the second adhesive layer 25, some of the metal particles 252 are exposed from (or protruded from) the adhesive material 251, which form protrusions protruding from the surface 25-s. In some embodiments of the present disclosure, the surface 25-s of the adhesive layer 25 includes a substantially flat surface and/or a rough surface with protruded portions. In some embodiments of the present disclosure, the metallic TIM layer 24 extends between the protruded portions and between the protrusions. In some embodiments of the present disclosure, the upper portion of the second adhesive layer 25 is removed by wet etching or dry etching. In some embodiments of the present disclosure, upper the portion of the second adhesive layer 25 is removed by a chemical process. In some embodiments of the present disclosure, the upper portion of the second adhesive layer 25 is removed by having a portion of the resin material of the adhesive material 251 evaporated from the second adhesive layer 25 by a laser process. In some embodiments of the present disclosure, the portion of the second adhesive layer 25 is removed by a plasma process. In some embodiments of the present disclosure, the portion of the first adhesive layer 25 can be removed by using other known techniques. In some embodiments of the present disclosure, the second adhesive layer 25 can be replaced with a metallic coating layer such as the nickel/gold (Ni/Au) coating or the silver (Ag) coating, as used in the embodiment with respect to FIG. 1.

Figure 3F:
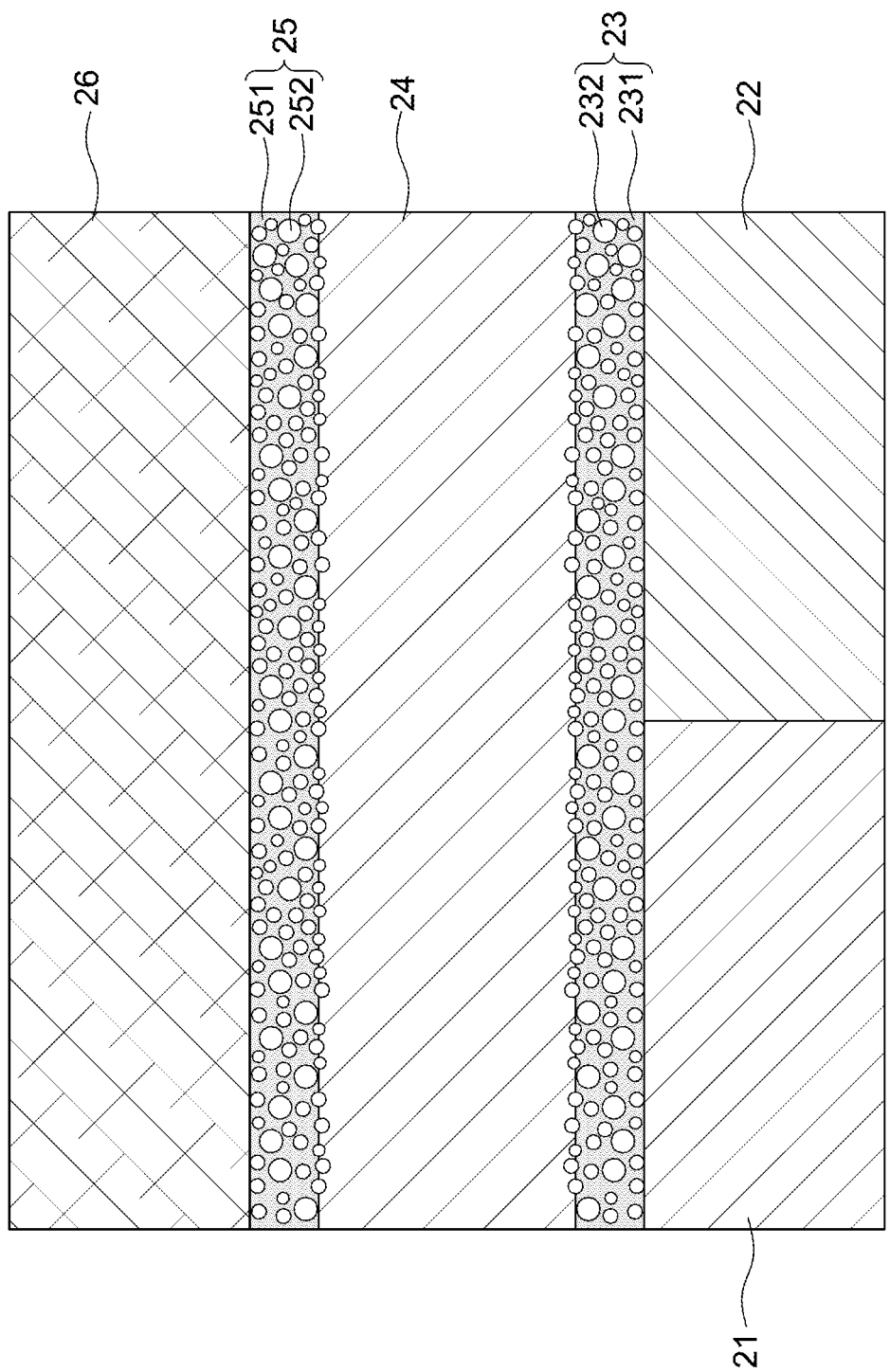

Referring to FIG. 3F, the combination of the heat spreading component 26 and the second adhesive layer 25 is disposed on the metallic TIM layer 24 with the surface 25-s facing the metallic TIM layer 24. In some embodiments of the present disclosure, the metallic TIM layer 24 is cured after the heat spreading component 26 and the second adhesive layer 25 being disposed on the metallic TIM layer 24, so that the metal particles 252 exposed from the second adhesive layer 25 are at least partially embedded in (or accommodated by) the metallic TIM layer 24. Since the metallic TIM layer 24 and the metal particles 252 both includes metal materials, a strong bonding will be formed at the interfaces between the metallic TIM layer 24 and the metal particles 252.

Figure 4B:
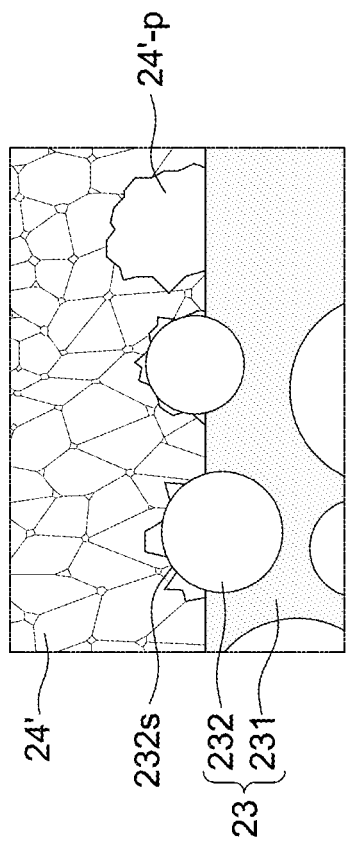
FIG. 4A and FIG. 4B each illustrates a schematic cross-sectional view of a portion of an electronic package according to some embodiments of the present disclosure.
Figure 4A:
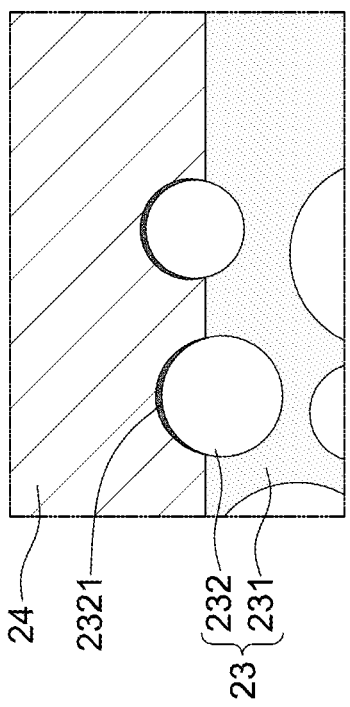

FIG. 4A illustrates a schematic cross-sectional view of a portion of the electronic package 2 according to some embodiments of the present disclosure. More specifically, FIG. 4A illustrates a schematic cross-sectional view of the box "A" enclosed by the dashed-line box as shown in FIG. 3D. As shown in FIG. 4A, a bonding structure 2321 is formed between the metallic TIM layer 24 and the metal particle 232. In some embodiments of the present disclosure, the bonding structure 2321 includes an alloy, a compound, and/or a complex. In the case that the metallic TIM layer 24 includes an indium (or indium solder) material according to some embodiments of the present disclosure, the bonding structure 2321 would include an intermetallic compound (IMC) structure.

FIG. 4B illustrates a schematic cross-sectional view of a portion of the electronic package 2 according to some embodiments of the present disclosure. More specifically, FIG. 4A illustrates a schematic cross-sectional view of the box "A" enclosed by the dashed-line box as shown in FIG. 3D. As shown in FIG. 4B, in some embodiments of the present disclosure, the metallic TIM layer 24 may be a sintered structure 24' such as a silver sinter structure. As shown in FIG. 4B, the sintered structure 24' includes a plurality of pores 24'-p, and some of the pores 24'-p may be located adjacent to the first adhesive layer 23 with an opening facing the first adhesive layer 23. In some embodiments of the present disclosure, some of the metal particles 232 are embedded in or accommodated by the pores 24'-p of the sintered structure 24'. As shown in FIG. 4B, some portions of the surface 232s contact with some of the sidewalls of the sintered structure 24', and a metal-to-metal bonding is thus formed between the metal particles 232 and the sintered structure 24'. As shown in FIG. 4B, some portions of the surface 232s are spaced apart from some of the sidewalls of the sintered structure 24'.

As illustrated in FIG. 4A, since bonding structure (including the intermetallic compound (IMC) structure 2321) can be formed between metal particles 232 in the first adhesive layer 23 and the metallic TIM layer 24, the first adhesive layer 23 provides a strong bonding force between the metallic TIM layer 24 and the first adhesive layer 23. Also, the adhesive material 231 in the adhesive layer 23 provide strong adhesion to the electronic device 21 as well as the encapsulant 22. Therefore, the first adhesive layer 23 can provide enhanced connections among the metallic TIM layer 24, the electronic device 21, and the encapsulant 22. Thus, the first adhesive layer 23 can be used to replace the metallization layer 12 described above.

Also, as illustrated in FIG. 4B, the metal particles 232 in the first adhesive layer 23 and the sintered structure 24' may be bonded to each other through metal-to-metal bonding, and thus the first adhesive layer 23 provides a strong bonding force between the sintered structure 24' and the first adhesive layer 23. Also, the adhesive material 231 in the adhesive layer 23 provide strong adhesion to the electronic device 21 as well as the encapsulant 22. Therefore, the first adhesive layer 23 can provide enhanced connections among the sintered structure 24', the electronic device 21, and the encapsulant 22. Thus, the first adhesive layer 23 can be used to replace the metallization layer 12 described above.

The use of the first adhesive layer 23 to replace the intermediate layer 12 has at least the following advantages. First, the first adhesive layer 23 does not include gold (Au) material, and thus has a lower cost. In addition, as the first adhesive layer 23 includes both the adhesive material 231 and the metal particles 232, the first adhesive layer 23 is capable of providing strong bonding to metallic thermal interface materials while also capable of providing strong adhesion to non-metal materials such as semiconductor materials (e.g., silicon) or polymer materials (e.g., epoxy compound). Besides, using the metal particles 232 in the first adhesive layer 23 provides better thermal conductivity than using adhesive materials only, and thus improves heat dissipation for the electronic device 21.

Similarly, the use of the second adhesive layer 25 to replace the metallic coating layer 14 has at least the following advantages. First, the second adhesive layer 25 may not include gold (Au) material, and thus has a lower cost. In addition, as the second adhesive layer 25 includes both the adhesive material 251 and the metal particles 252, the adhesive layer 25 is capable of providing strong bonding to metallic thermal interface materials while also capable of providing strong adhesion to metal materials (e.g., metal materials used in a heat spreading component). Besides, the use of the metal particles 252 in the second adhesive layer 25 provides better thermal conductivity, and thus improves heat dissipation for the electronic device 21. Furthermore, since the second adhesive layer 25 can be the same as the first adhesive layer 23, the same layers can be applied between the electronic device 21 and the metallic TIM layer 24, and between the TIM layer 24 and the heat spreading component 26. Thus, the manufacturing process of the electronic package 2 can be simplified.

Additionally, as mentioned above, since the first adhesive layer 23 and the second adhesive layer 25 can be applied through a spraying, spin coating, or printing process, the use of the adhesive layers 23 and 25 make the manufacturing of the electronic package 2 simpler and more cost effective.

Figure 5:
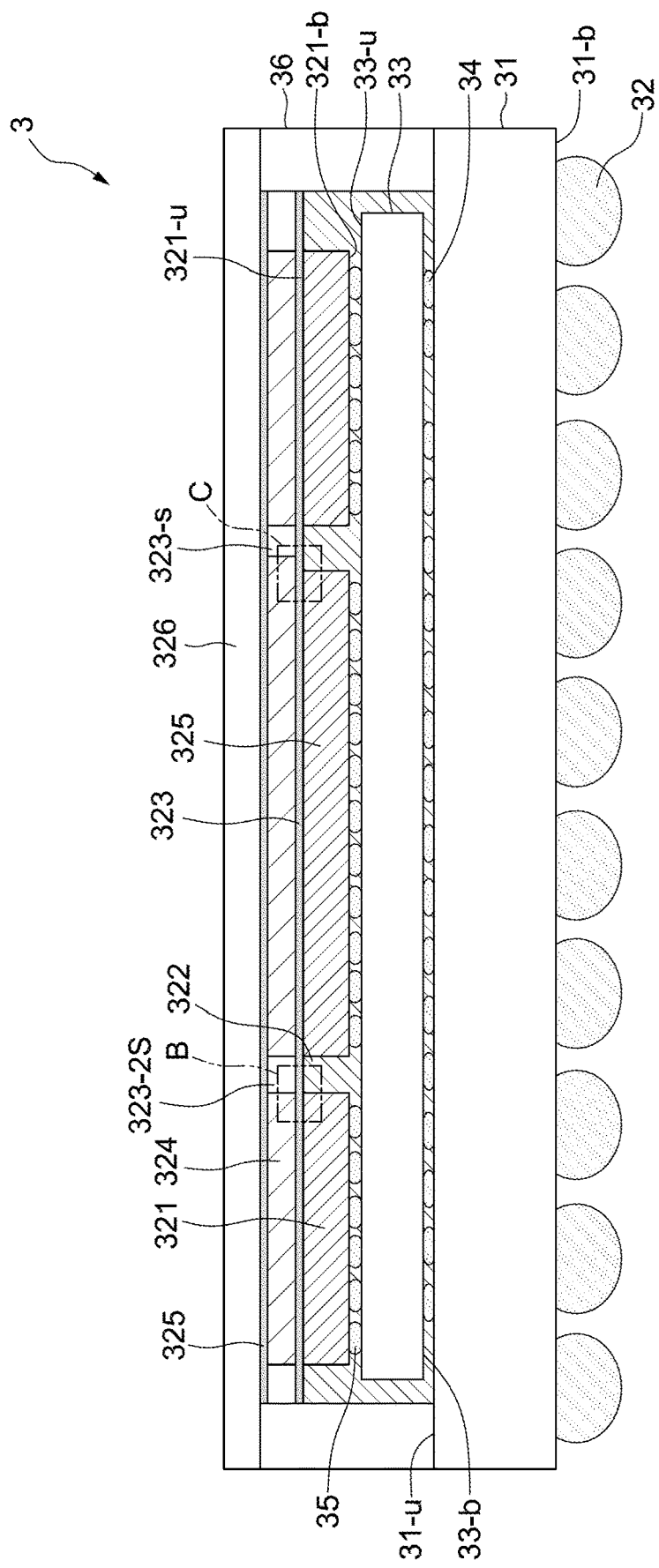
FIG. 5 illustrates a schematic cross-sectional view of an electronic package according to some embodiments of the present disclosure.

FIG. 5 illustrates a schematic cross-sectional view of an electronic package 3 according to some embodiments of the present disclosure. Referring to FIG. 5, electronic package 3 includes: a substrate 31; electrical connections 32 formed on the lower surface 31-b of the substrate 31; a second electronic device 33; electrical connections 34 formed on the lower surface 33-b of the second electronic device 33 and contacting the upper surface 31-u of the substrate 31; the electronic devices 21; electrical connections 35 formed on the lower surfaces 21-b of the electronic devices 21 and contacting the upper surface 33-u of the second electronic device 33; the encapsulant 22 formed over the substrate 31 and encapsulating the electronic devices 321, the second electronic device 33, the solders 34 and the solders 35; the first adhesive layer 323 formed on the upper surface 321-*u* of the electronic device 321 and on the upper surface of the encapsulant (which is coplanar with the upper surface 21-*u*); the metallic TIM layers 324 formed on the first adhesive layer 232; a spacer 36 formed on the substrate 31 and surrounding the electronic devices 321, the second electronic device 33, the solders 34 and the solders 35; the encapsulant 322, the metallic TIM layers 324, and the first and second adhesive layers 323 and 325; and the heat spreading component 326, with the second adhesive layer 325 formed thereon, disposed on the metallic TIM layers 324 and the spacer 336.

In some embodiments of the present disclosure, the metallic TIM layer 324 is similar to or the same as the metallic TIM layer 24 shown in FIG. 2. In some embodiments of the present disclosure, the first adhesive layer 323 is similar to or the same as the first adhesive layer 23 shown in FIG. 2. In some embodiments of the present disclosure, the second adhesive layer 325 is similar to or the same as the first adhesive layer 25 shown in FIG. 2.

In some embodiments of the present disclosure, the substrate 31 includes a redistribution layer (RDL). In some embodiments of the present disclosure, the encapsulant 322 is optional. In some embodiments of the present disclosure, the metallic TIM layers 324 are formed on the first adhesive layer 323 through a patterning process. In some embodiments of the present disclosure, at least a portion of the encapsulant 322 is free from being covered by the TIM layer 324. In some embodiments of the present disclosure, the metallic TIM layers 324 covers the portion of the first adhesive layer 323 which is over the electronic devices 21 but does not cover the entire first adhesive layer 323. In some embodiments of the present disclosure, the metallic TIM layers 324 are physically separated from each other, leaving at least one space 323-2S or 323-3S therebetween.

Figure 6:
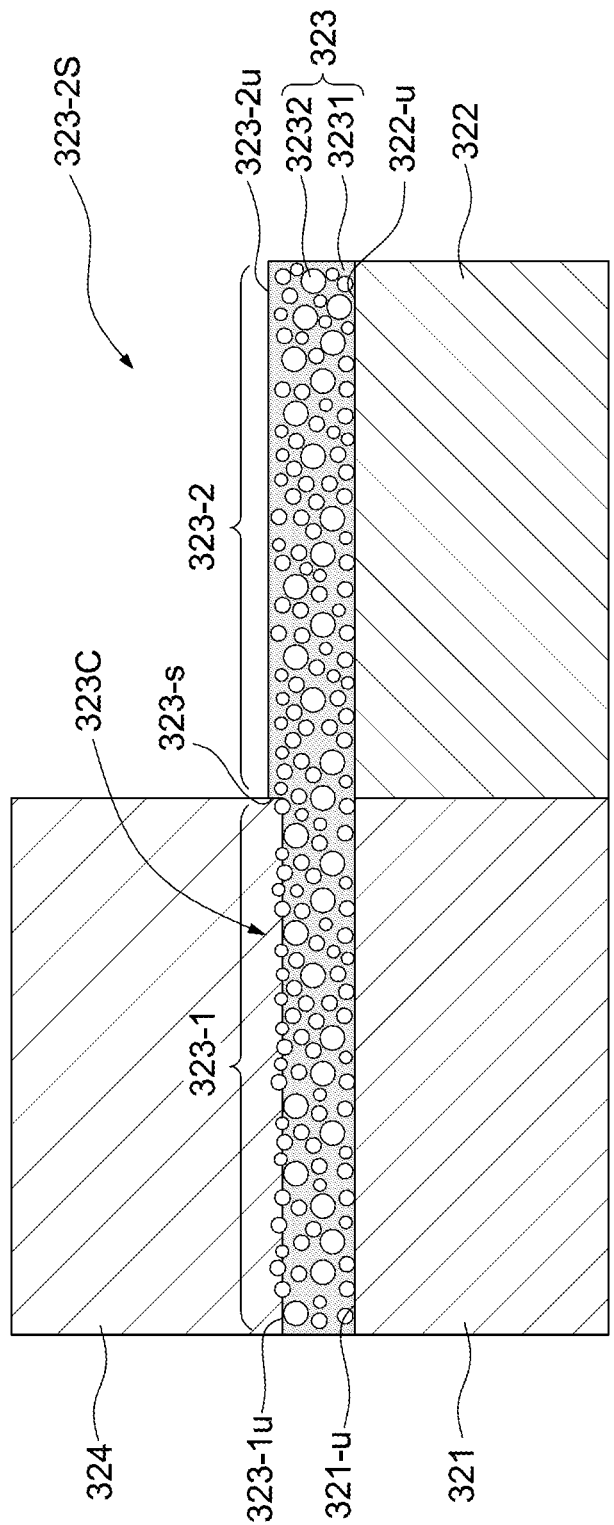
FIG. 6 illustrates a schematic cross-sectional view of a portion of an electronic package according to some embodiments of the present disclosure.

FIG. 6 illustrates a schematic cross-sectional view of a portion of the electronic package 3 as shown in the box "B" enclosed by the dashed-line box as shown in FIG. 5 according to some embodiments of the present disclosure. Referring to FIG. 6, the portion of the electronic package 3 includes an electronic device 21, an encapsulant 22, a first adhesive layer 23, a metallic thermal interface material (TIM) layer 24', a second adhesive layer 25, and a heat spreading component 26. As shown in FIG. 6, the encapsulant 22 is adjacent to or encapsulates the electronic device 21. The first adhesive layer 23 is formed on a backside (non-active side) surface 21-*u* of the electronic device 21 and on an upper surface 22-*u* of the encapsulant 22. In some embodiments of the present disclosure, the backside surface 21-*u* is substantially coplanar with the upper surface 22-*u* of the encapsulant 22. The metallic TIM layer 24 is formed on the first adhesive layer 23.

As shown in FIG. 6, only an upper portion of a first region 323-1 of the first adhesive layer 323 is removed. The portion of the electronic package 3 as shown in FIG. 6 can be formed using a method similar to the method of manufacturing the electronic package 2.

As shown in FIG. 6, the first adhesive layer 323 includes a first region 323-1 and a second region 323-2. The first region 323-1 is arranged above the upper surface 321-*u* of the electronic device 321, and the second region 323-2 is above the upper surface 322-*u* of the encapsulant 322. As shown in FIG. 6, an upper portion of the first region 323-1 of the first adhesive layer 323 has been removed while an upper portion of the second region 323-2 of the first adhesive layer 323 is not removed, so that a new upper surface 323-1*u* is formed and that a recessed portion 323C is formed in the first region 323-1. As shown in FIG. 6, a sidewall 323-*s* of the first adhesive layer 323 is thus formed. As the upper portion of the first region 323-1 of the first adhesive layer 323 being removed, some of the metal particles 3232 are at least partially exposed from the first adhesive layer 323, which form protrusions protruding from the upper surface 323-1*u*. In some embodiments of the present disclosure, the upper surface 323-1*u* of the adhesive layer 323 includes a substantially flat surface and/or a rough surface with protruded portions. In some embodiments of the present disclosure, the metallic TIM layer 324 extends between the protruded portions and between the protrusions.

As shown in FIG. 6, the metallic TIM layer 324 is formed on the first region 323-1 of the first adhesive layer 323 so that the metal particles 3232 bonded with the metallic TIM layer 324 are in the first region 323-1 of the first adhesive layer 323. The metal particles 232 in the second region 323-2 of the first adhesive layer 323 are free from being bonded with the metallic TIM layer 324.

Since the TIM layer 324 includes metal materials such as indium (or indium solder) and/or silver sinter, the cost of the TIM layer 324 relatively high. Thus, as shown in FIG. 5 and FIG. 6, the metallic TIM layers 324 are formed only on some portions of the first adhesive layer 323 which are over the electronic devices 321 but do not cover the entire first adhesive layer 323, and the metallic TIM layers 324 are physically separated from each other, leaving at least one space 23-2S therebetween. In this way, at least the following advantages can be obtained. First, forming the metallic TIM layers 324 only on some portions of the first adhesive layer 323 reduces the volume of the thermal interface material used in the electronic package 3. As less metallic thermal interface material is used, the cost for manufacturing the electronic package 3 can be reduced.

Figure 7:
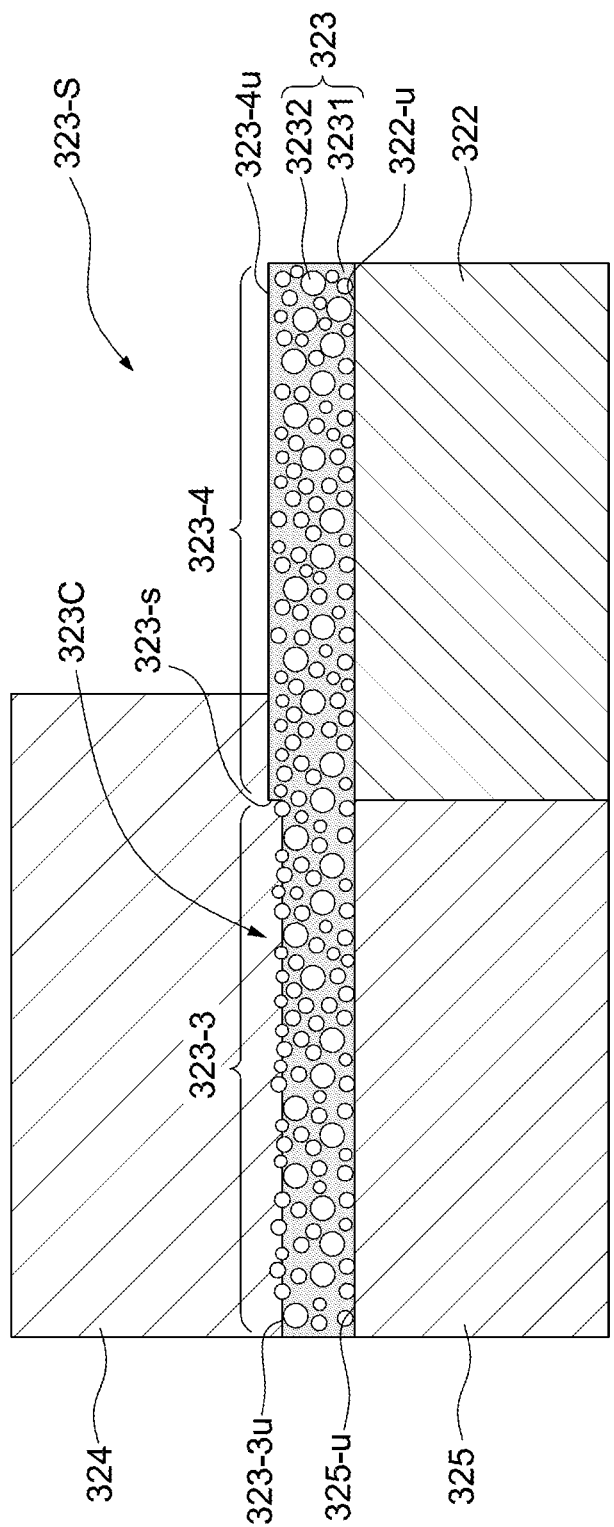
FIG. 7 illustrates a schematic cross-sectional view of a portion of an electronic package according to some embodiments of the present disclosure.

FIG. 7 illustrates a schematic cross-sectional view of the box "C" enclosed by the dashed-line box as shown in FIG. 5. As shown in FIG. 7, only an upper portion of a third region 323-3 of the first adhesive layer 323 is removed. The portion of the electronic package 3 as shown in FIG. 7 can be formed using a method similar to the method of manufacturing the electronic package 2.

As shown in FIG. 7, the first adhesive layer 323 includes a third region 323-3 and a fourth region 323-4. The third region 323-3 is arranged above the upper surface 325-*u* of the electronic device 325, and the fourth region 323-4 is above the upper surface 322-*u* of the encapsulant 322. As shown in FIG. 7, an upper portion of the third region 323-3 of the first adhesive layer 323 has been removed so that some of the metal particles 3232 are at least partially exposed from the first adhesive layer 323, while an upper portion of the fourth region 323-4 of the first adhesive layer 323 is not removed.

The TIM layer 324 may be formed on the third region 323-3 of the first adhesive layer 323 but not formed on the fourth region 323-4 of the first adhesive layer 323 in the beginning. However, the TIM layer 324 includes indium (or indium solder) material and the melting point of indium is relatively low (which is about 110 degrees Celsius) and is lower than the melting point of the solders, and thus indium can overflow when enduring a thermal process (e.g., a reflow process of the solders) with a temperature higher than its melting point. In such case, the space 323-S over the fourth region 323-4 of the first adhesive layer 323 is capable of accommodating or confining the overflow of the indium. That is, as shown in FIG. 7, a portion of the fourth region 323-4 of the first adhesive layer 323 may be covered by the TIM layer 324.

Referring to FIG. 7, since the upper portion of the third region 323-3 of the first adhesive layer 323 is removed while an upper portion of the fourth region 323-4 of the first adhesive layer 323 is not removed, so that a new upper surface 323-3u is formed and that a recessed portion 323C is formed in the first region 323-3. As shown in FIG. 7, a sidewall 323-s of the first adhesive layer 323 is thus formed. As the upper portion of the first region 323-3 of the first adhesive layer 323 being removed, some of the metal particles 3232 are at least partially exposed from the first adhesive layer 323, which form protrusions protruding from the upper surface 323-3u. In some embodiments of the present disclosure, the upper surface 323-3u of the adhesive layer 323 includes a substantially flat surface and/or a rough surface with protruded portions. In some embodiments of the present disclosure, the metallic TIM layer 324 extends between the protruded portions and between the protrusions. The metal particles 3232 at least partially exposed from the upper surface of the third region 323-3 of the first adhesive layer 323 are bonded with the metallic TIM layer 324. Since the upper portion of the fourth region 323-4 of the first adhesive layer 323 is not removed, the metallic TIM layer 324 may cover the fourth region 323-4 of the first adhesive layer 323 but not bond with the metal particles 3232 in the fourth region 323-4 of the first adhesive layer 323.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for the purpose of illustration only, and that practical implementations of the structures described herein can be spatially arranged in any orientation or manner, provided that the merits of the embodiments of this disclosure are not deviated from by such an arrangement.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to +10% of that numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. For example, two numerical values can be deemed to be "substantially" the same or equal if a difference between the values is less than or equal to +10% of an average of the values, such as less than or equal to +5%, less than or equal to +4%, less than or equal to +3%, less than or equal to #2%, less than or equal to +1%, less than or equal to +0.5%, less than or equal to +0.1%, or less than or equal to +0.05%.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood to flexibly include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:
   an electronic component;
   a thermal conductive structure above the electronic component; and
   a first intermediate layer between the electronic component and the thermal conductive structure,
   wherein the first intermediate layer comprises a metal particle exposed from a surface of the first intermediate layer and contacting the thermal conductive structure,
   wherein the thermal conductive structure comprises a first pore defined by a first inner sidewall of the thermal conductive structure, and the metal particle contacts a portion of the first inner sidewall; and
   wherein the metal particle is partially embedded in the first intermediate layer and partially embedded in the thermal conductive structure.

2. The electronic package of claim 1, wherein the thermal conductive structure comprises a sintered structure having a plurality of gaps within the sintered structure, at least one of the gaps is exposed to the first pore, and the metal particle is exposed to at least another one of the gaps.

3. The electronic package of claim 1, wherein the thermal conductive structure has a first cavity recessed from an upper surface and a second cavity recessed from a lower surface opposite to the upper surface, and the first pore is defined by the first cavity or the second cavity.

4. The electronic package of claim 3, wherein the first pore is defined by the first cavity and a sidewall of the first intermediate layer.

5. The electronic package of claim 4, further comprising a second intermediate layer over the upper surface of the thermal conductive structure, wherein the thermal conductive structure comprises a second pore defined by the second cavity and a sidewall of the second intermediate layer.

6. An electronic package, comprising:
an electronic component;
a thermal conductive element above the electronic component; and
an intermediate layer between the electronic component and the thermal conductive element,
wherein an upper surface of the intermediate layer comprises a recessed portion and an upper portion, the thermal conductive element extends into the recessed portion of the upper surface of the intermediate layer, and the thermal conductive element exposes a portion of the upper portion; and
wherein the thermal conductive element comprises a stepped portion partially covering the recessed portion and the upper portion of the upper surface of the intermediate layer.

7. The electronic package of claim 6, wherein the intermediate layer comprises a first metal particle exposed by the recessed portion of the upper surface and a second metal particle embedded in the upper portion of the upper surface, and an elevation of a top surface of the first metal particle is lower than an elevation of a top surface of the second metal particle with respect to a top surface of the electronic component.

8. The electronic package of claim 6, wherein the intermediate layer comprises a portion directly under the thermal conductive element and having a non-consistent thickness.

* * * * *